(12) United States Patent
Petrick et al.

(10) Patent No.: US 9,549,467 B1
(45) Date of Patent: Jan. 17, 2017

(54) PRINTED CIRCUIT BOARD ASSEMBLY FOR USE IN SPACE MISSIONS

(71) Applicant: The United States of America, as represented by the Administrator of the National Aeronautics and Space Administration, Washington, DC (US)

(72) Inventors: David J. Petrick, Severna Park, MD (US); Luan Vo, Springfield, VA (US); Dennis Albaijes, Hialeah, FL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 112 days.

(21) Appl. No.: 14/041,407

(22) Filed: Sep. 30, 2013

Related U.S. Application Data

(60) Provisional application No. 61/790,944, filed on Mar. 15, 2013.

(51) Int. Cl.
  H05K 7/10 (2006.01)
  H05K 7/12 (2006.01)
  H05K 1/11 (2006.01)

(52) U.S. Cl.
  CPC .................................. *H05K 1/113* (2013.01)

(58) Field of Classification Search
  USPC ........................................ 361/767, 752, 808
  See application file for complete search history.

(56) References Cited

U.S. PATENT DOCUMENTS

| | | | | |
|---|---|---|---|---|
| 6,054,767 A * | 4/2000 | Chia | ................... | H01L 23/5382 257/691 |
| 2013/0258624 A1* | 10/2013 | Hardin | ......................... | 361/773 |

* cited by examiner

*Primary Examiner* — Andargie M Aychillhum

(57) ABSTRACT

An electronic assembly for use in space missions that includes a PCB and one or more multi-pin CGA devices coupled to the PCB. The PCB has one or more via-in-pad features and each via-in-pad feature comprises a land pad configured to couple a pin of the one or more multi-pin CGA devices to the via. The PCB also includes a plurality of layers arranged symmetrically in a two-halves configuration above and below a central plane of the PCB.

10 Claims, 5 Drawing Sheets

PRINTED CIRCUIT BOARD ASSEMBLY FOR USE IN SPACE MISSIONS

This application claims priority to Provisional Application No. 61/790,944, entitled "SPACECUBE 2.0 SYSTEM." filed Mar. 15, 2013. The content of this application is hereby Incorporated by reference.

The invention described herein was made by an employee of the United States Government and may be manufactured and used by or for the Government of the United States of America for governmental purposes without the payment of any royalties thereon or therefor.

FIELD

The aspects of the present disclosure relate generally to space-based electronic apparatus, and in particular, to high quality printed circuit boards for use in space missions.

BACKGROUND

Many space-based science missions require "next generation" on-board processing capabilities to meet the specified goals of each mission. These missions use advanced instrumentation systems such as laser altimeter, radar, lidar, and hyper-spectral instruments, which require advanced on-board processing capabilities to facilitate the timely conversion of planetary or earth science data into planetary or earth science information. Currently available processing systems do not have the processing power required by these advanced information systems. Both an "order of magnitude" increase in processing power and the ability to "reconfigure on the fly" are required to implement algorithms that detect and react to events, to produce data products on-board for applications such as direct downlink, quick look, and "first responder" real-time awareness, to enable "sensor web" multi-platform collaboration, and to perform on-board "lossless" data reduction by migrating typical ground-based processing functions on-board, thereby reducing on-board storage and downlink requirements.

The SpaceCube™ is a Field Programmable Gate Array (FPGA) based on-board science data processing system developed at the US Government's NASA Goddard Space Flight Center (GSFC). The goal of the SpaceCube program is to provide one to two orders of magnitude improvements in on-board computing power while lowering relative power consumption and cost. The SpaceCube design strategy incorporates commercial radiation-tolerant FPGA technology and couples it with an upset mitigation software architecture to provide "order of magnitude" improvements in computing power over traditional radiation-hardened flight systems.

Achieving these goals will require using newly available FPGA and other devices which have increased numbers of input and output (I/O) pins, and mounting these devices on both sides of each printed circuit board (PCB). Equipment area is a valuable commodity on space missions; therefore, it is also important to keep the PC boards as small as possible and to increase the part density mounted on each board. Large improvements in processing capability leads to use of processing elements that require significant increase of the number of external interconnections needed on the processor boards. The existing connectors used for space flight do not provide the density of contacts needed to provide the increased interconnect requirements of the improved processing boards.

It is important to use high quality printed circuit boards (PCB) in equipment included in space missions. A PCB is an assembly that mechanically supports and electrically connects electronic components using conductive tracks, pads and other features etched from sheets of conductive material, typically copper or other suitable conductive metals, laminated onto a non-conductive substrate. To achieve a very high quality, PCBs intended for space flight are typically designed to meet industry quality standards such as IPC 6012B Class 3/A. IPC is a standards developing organization accredited by the American National Standards Institute whose aim is to standardize the manufacture of electronic equipment. Having a high quality PCB manufactured to well defined and trusted standards gives the customer a higher confidence that the PCB will survive the environmental stresses found in space and meet its life requirements. Until recently, designing to the Class 3/A standard has not been much of a problem. Modern PCBs often have multiple layers of conductive material and non-conductive substrate to allow routing of higher numbers of signals on densely populated boards. Designers typically use one side of the PCB for the majority of parts, and these "older" parts are in packages that make it fairly easy to meet the Class 3/A requirement. However, it is becoming more of a standard to use both sides of the board in order to reduce mass and increase performance. In addition, part manufacturers are cramming more I/O pins into packages and increasing the pin density per square inch. This makes designing to the Class 3/A quality standard difficult, especially for packages that contain 100 to 2000 pins. Using standard practices for building new-age space flight circuit boards currently adopted by space equipment providers such as GSFC makes it impossible to meet the Class 3/A requirements. PCB designs typically run into difficulty where changes made to meet one aspect of the Class 3/A standard cause other aspects to be violated thereby making it difficult and often impossible to meet the full requirements of the standard.

Accordingly, it would be desirable to provide a circuit board that address at least some of the problems identified above.

BRIEF DESCRIPTION OF THE DISCLOSED EMBODIMENTS

As described herein, the exemplary embodiments overcome one or more of the above or other disadvantages known in the art.

One aspect of the disclosed embodiments relates to an electronic assembly for use in space missions that includes a PCB and one or more multi-pin Column Grid Array (CGA) devices coupled to the PCB. The PCB has one or more via-in-pad features and each via-in-pad feature comprises a land pad configured to couple a pin of the one or more multi-pin CGA devices to the via. The PCB also includes a plurality of layers arranged symmetrically in a two-halves configuration above and below a central plane of the PCB. Blind vias are used in each "half" of the board to maximize the mutable signals from the CGA device. Connections between the back-to-back CGA devices are made with "through-hole" vias.

Another aspect of the disclosed embodiments relates to a PCB for mechanically supporting and electrically connecting electronic components. The PCB comprises a plurality of layers wherein each layer has a layer of conductive material bonded to a layer of insulating material. The PCB also includes one or more via-in-pad features, wherein each via-in-pad feature includes a land pad and a via which is substantially centered in the land pad. The plurality of layers are arranges in a two-halves configuration and symmetrically disposed in a first half above a central plane of the PCB and a second half below the central plane of the PCB.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DETAILED DESCRIPTION

Figure 1:
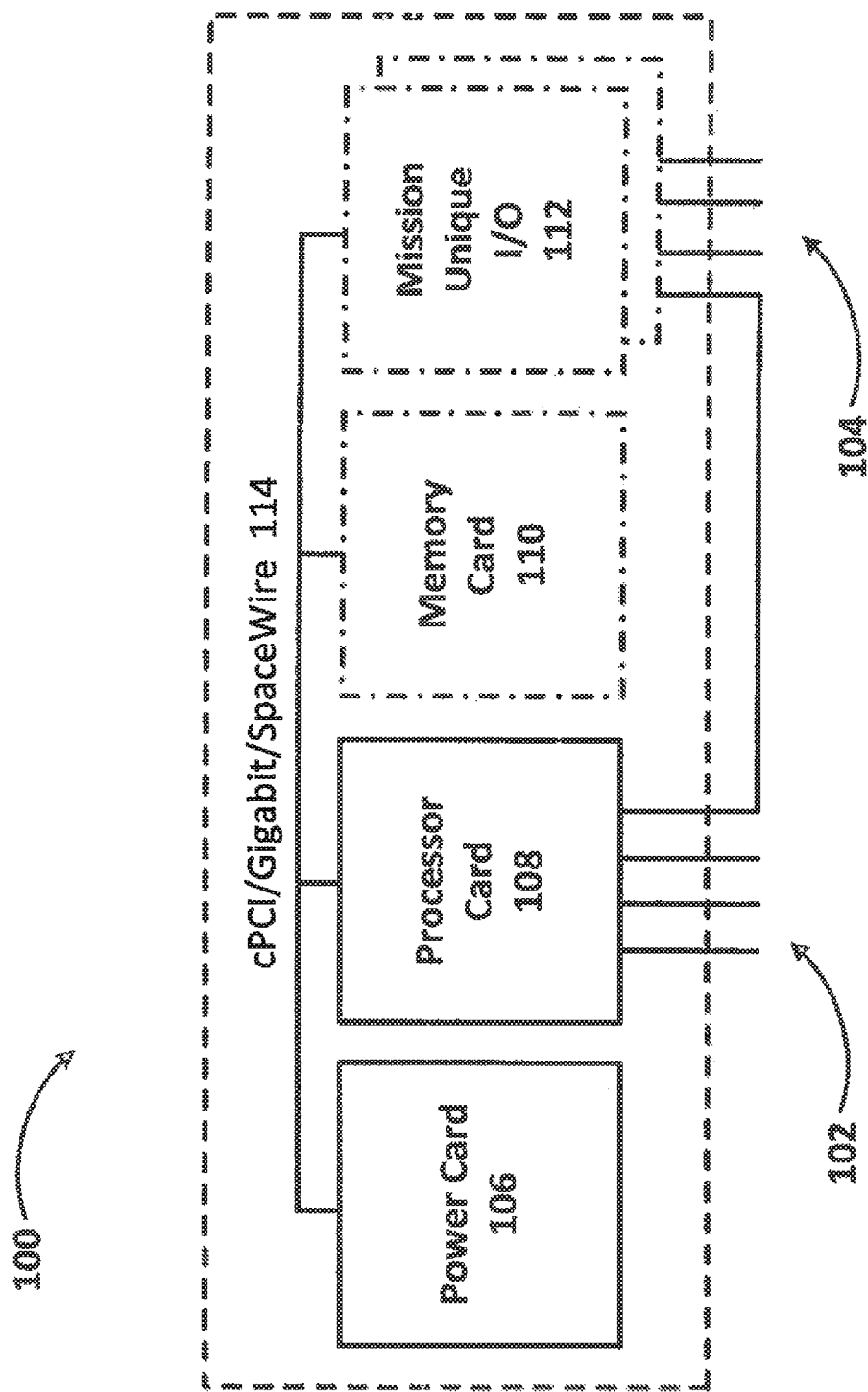
FIG. 1 illustrates a block diagram of a space qualified processing system incorporating aspects of the present disclosure.

FIG. 1 illustrates a card level architectural block diagram of a processing system 100 designed for use in space missions. The processing system 100 is designed around a processor card 108 which is based on newly developed FPGA technology and is configured to provide advanced parallel processing capabilities as well as software mitigation. The processor board 108 is designed to provide one to two orders of magnitude improvements in on-board computing speeds while lowering relative power consumption and cost as compared to currently available space based processors. For example, the processor board may be designed to provide about 5000 million instructions per second (MIPS) of computing speed while currently available space based processors provide less than about 300 MIPS. The processor card 108 includes a number of flash memory devices which may be electrically re-programmed while in the system to provide on-the-fly reconfiguration capabilities required by space missions. The processor card 108 is supported by a power card 106, an optional memory card 110, and an optional mission unique input/output (I/O) card 112. To tie the system cards 106, 108, 110, 112 together, a backplane 114 is included that provides a compact peripheral component interface (cPCI) bus as well computer networks, such as Ethenet and SpaceWire networks. The power card 106 provides a few widely used voltages that are consumed by the other cards 108, 110, and 112 in the system. Voltages from the power card 106 are distributed to each of the other cards where the voltages may be used directly or conditioned further by point of load (POL) power conditioning modules, which are physically located close to each load. A memory card 110 provides non-volatile data storage, which may be used to store mission data, such as instrument images, etc. Each space mission may include its own unique experiments and scientific instruments which often have unique interface or input-output (I/O) requirements. One or more mission unique I/O cards 112 can be included in the processing system to support the interface requirements of the experiments and instruments included in that mission. The mission unique I/O cards interface directly to the experiments and instruments through external interfaces 104, while the processor card 108 has a separate set of interfaces for standard data and analog I/O 102. In certain embodiments it is desirable to allocate functions to physical cards differently than is shown in the processing system 100, such as, for example, an engineering prototype may be created with all functionality on a single board or card.

Circuit boards or cards designed for space flight are normally required to meet stringent industry quality standards such as the PCB manufacturing standards published by IPC, such as IPC 6012B Class 3/A and the newer IPC 6012C standard. This is true throughout the space industry and is becoming increasingly prevalent within the military and commercial industries as well. Until recently, meeting this standard has not been an overly difficult design problem. PCBs are typically designed using one side of the board for the majority of parts with only a few smaller parts on the other side and these "older" parts are in packages that make it fairly easy to meet the requirements of the Class 3/A standard. This is due to the use of devices that have lower pin counts and/or larger pin-to-pin pitch sizes. Larger pin pitch allows for larger PCB board feature sizes, which allows manufacturers to more easily meet the Class 3/A quality standard requirements. However, to reduce mass and increase performance, it is becoming necessary to use both sides of a board. In addition, part manufacturers are including more I/O pins on packages and increasing the pin densities favoring column grid array (CGA) packages with large numbers of pins and small pin pitch (spacing between the pins). This creates problems that are difficult to solve with current board layout techniques and features, especially for component packages that contain 100 to 2000 pins, or more.

Space equipment providers, such as GSFC, typically have general layout rules for building PCBs with CGA devices. These guidelines usually require a design to use a standard via breakout defined for use within the organization. The guidelines are often based on an organization's comfort with a particular process because it has provided good results in the past with larger pitch devices. In general, these guidelines lead to a Class 3/A board that is more reliable due to the added manufacturing tolerances that allow the PCB to be built with larger feature sizes. However, it can be shown that with high-density devices, such as the 1752-pin CGA FPGA being used in the processing system 100, it is not a possible to meet the Class 3/A standard while using existing layout guidelines.

Figure 2:
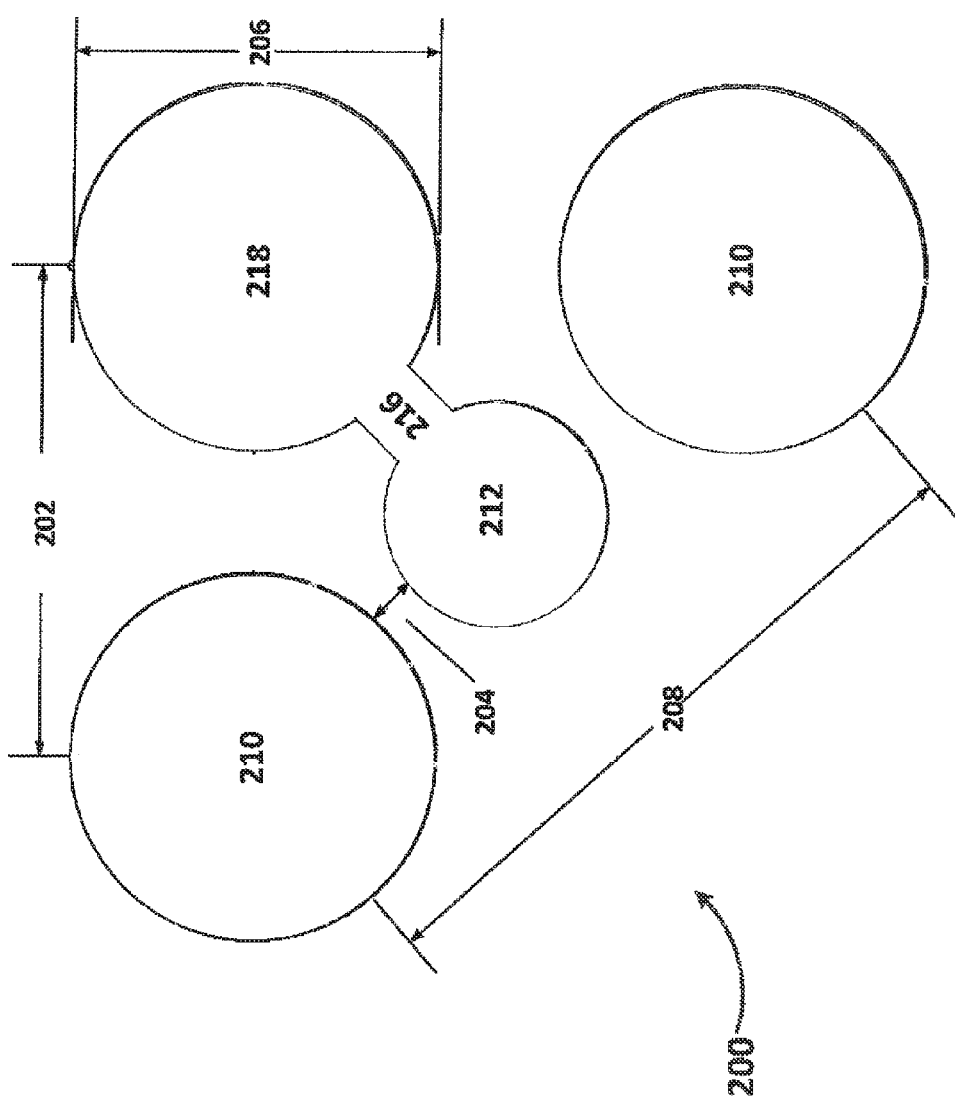
FIG. 2 illustrates a standard via breakout incorporating aspects of the present disclosure.

A via is a connection between layers of a multi-layer PCB that goes through the plane of the board and through one or more adjacent layers and is used to electrically connect signals on different layers of the PCB. A standard via breakout includes a trace leaving a land pad of a CGA device and branching to a via that is approximately centered between four land pads. A land pad is an area of conductive material on the surface of a PCB configured to make electrical connection between the PCB and a pin of a device mounted on the PCB. FIG. 2 illustrates a standard via breakout 200 used at GSFC to layout circuit boards containing CGA devices. An array of pads 210, 218 is formed on the board so that the distance between pads Xpp is equal to the device pitch which is the distance between pins in a row. A trace 216 is included in the standard via breakout 200 to connect via 212 to a land pad 218. The pad to pad distance or the distance between pads in a row Xpp is dependent on the diameter of each pad Xpad(D). A via 212 can be centered between any four pads 210. As shown in FIG. 2, only three pads need to be included in the standard via breakout 200 to fully define the via 212 geometry. The via 212 dimensions are dependent on the diagonal distance between pads Xd as shown in equation (1):

$$Xd = \sqrt{2Xp^2} \quad (1)$$

The maximum via diameter (Xvia(D)max) can then be found from equation (2):

$$Xvia(D)max = Xd - Xpad(D) - 2 \times Xpv(min) \quad (2)$$

Where Xpv(min) is the minimum recommended distance between a pad 210 and the via 212. For a large CGA device, such as the 1752 pin FPGA used in the processing system 100, the pin pitch or Xpp is typically 1 mm, the pad diameter is about 0.76 mm, and the minimum pad to via distance Xpv(min) is about 0.09 mm. The diagonal distance between pins for a device with a 1 mm pitch is given by equation (1) and is about 1.41 mm. The maximum via diameter Xvia(D))max can then be found using equation (2) to be about 0.46 mm or 18 mils. A mil is a unit of length equal to one thousandth of an inch. Common CGA devices with fewer than 1752 pins often have a device pitch of 1.27 mm or 50 mils and use a pad diameter Xpad(D) of about 0.8 mm, thus a CGA device with 1.27 mm pitch can have a maximum via diameter Xvia(D)max of about 0.82 mm or 32.2 mils.

In the standard via breakout 200 illustrated in FIG. 2, the via 212 is used to take the signal down to the appropriate inner layer within the PCB where the signal is routed to its destination. In order to guarantee that the via 212 will be strong enough, the via has a certain diameter with respect to the board thickness. This is referred to as the aspect ratio and is defined as board thickness/via diameter. During manufacturing of a board, vias are created using a small drill to make a hole or via in the board. If the via diameter or drill size is too small the drill may fracture during manufacturing of the via. Thus, the larger the thickness of the board, the bigger the via diameter or via drill size needs to be to avoid fracturing during the board manufacturing process. However, the issue with the standard via breakout is that as the pins get closer together (smaller device pitch), there becomes less room for the via. Once the device pitch drops below a certain level, the via diameter cannot be large enough to maintain manufacturing aspect ratios required to meet the desired quality standards.

There are many layout variables that factor into being able to build a PCB that meets the Class 3/A quality standard. Part placement, board thickness, via sizes, via dimensional requirements, trace width minimums, trace width separation, pad diameters, device pitch, pad-to-trace clearance, via-to-trace clearance, impedance control, power integrity, minimum dielectric thickness, as well as many other factors which all drive the ability to manufacture a board to meet the Class 3/A quality standard. What has been found during research and prototyping efforts is that when a design is created such that one factor or design constraint is met, another of the quality factors regarding a different variable is violated. The design variables or quality factors are linked to each other.

In the processing system 100 described with reference to FIG. 1 above, a pair of large FPGA devices are used to provide redundant processing power and support the software mitigation functionality. These FPGA are packaged in 1752-pin CGA devices where the I/O pins are arranged in a uniform 42 by 42 pin matrix with a 1 mm pitch. One major goal of the processing system 100 design technology is to keep board sizes as small as possible. To achieve this, two of the 1752 pin CGA devices are mounted in a back-to-back arrangement on opposite sides of the processor card 108, which further complicates the ability to lay out a Class 3/A board. In order to use the 1752-pin CGA devices, there must be many signal layers so that all of the pins can escape from beneath the 42×42 pin matrix. A back-to-back arrangement is where two CGA devices having the same pin matrix configuration are physically located directly opposite each another on the top and bottom of the PCB such that the pins of each device line up. A back-to-back arrangement inherently requires a thicker board because there are twice as many signals needing to escape from beneath the back-to-back devices. Thus, the back-to-back arrangement makes it impossible to breakout signals using a standard via breakout 200 while at the same time meeting Class 3/A quality standards.

In order to overcome the problems associated with the standard via breakout 200, a new technique for designing and laying out high-density CGA devices on a densely populated two sided board has been developed. To develop the new technique, a few main design goals were chosen to guide the processing card 108 design effort: maximizing performance within space allotted, excellent power integrity, excellent signal integrity, structural integrity, sufficient thermal paths to chassis, and staying within the manufacturing minimum requirements for building a PCB to meet the Class 3/A quality standard. The 1752-pin CGA device being used requires a pad diameter Xpad(D) of about 30 to 32 mils, which leaves only about 18 mils for the via diameter. The multi-layer circuit board being designed requires a large number of signal layers which results in a minimum via diameter of at least 26 mils.

Figure 3:
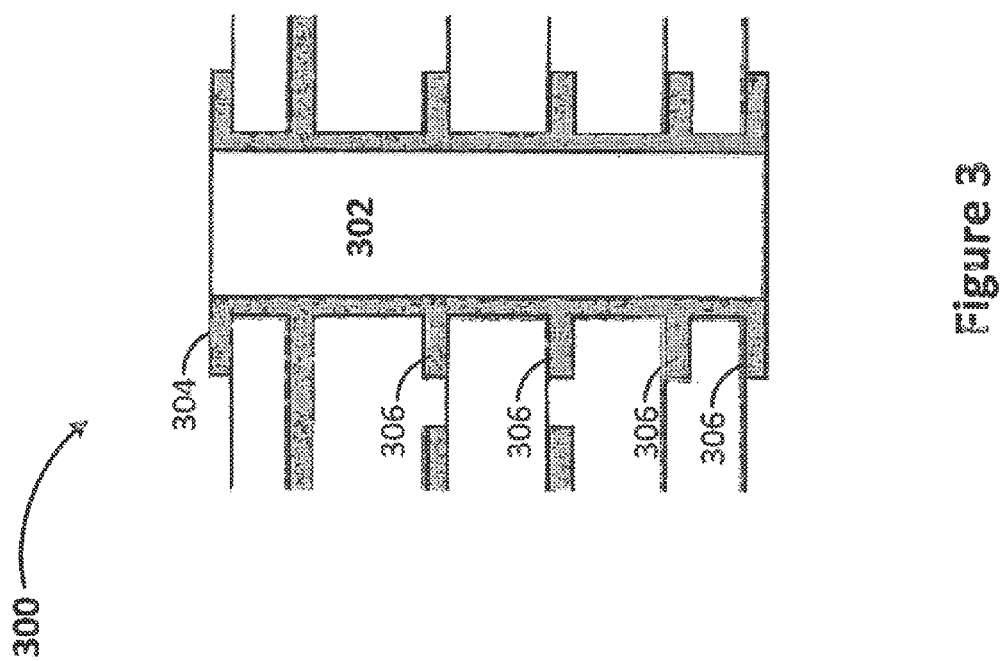
FIG. 3 illustrated a pad stack for a via-in-pad PCB feature incorporating aspects of the disclosed embodiments.

A new via-in-pad layout technique can be used to combine the land pads and via in the same area of the board thereby increasing the available via diameter. FIG. 3 illustrates a pad stack 300 for a via-in-pad PCB feature. It should be noted that the illustrated pad stack 300 represents only half of the PCB as a blind via goes only half way through the board. A via-in-pad 302 differs from a standard via breakout 200. With a standard via breakout 200 a trace goes from a pad to a via which is offset from the pad, whereas, in a via-in-pad feature, the via 302 is drilled right in the land pad 304. The via 302 is then filled and capped so that the pad meets flatness requirements necessary for installing a CGA device onto the board. The CGA devices used in the processor board 108 require a land pad 304 of at least 30 mil diameter. However, the blind vias allow a reduced drill size of about 8 mils for which the Class 3/A standard allows inner pads 306 in the pad stack 300 to be smaller, such as about 22 mils diameter. The smaller inner pads make more room available for signal routing on each inner layer.

The second problem encountered is power integrity. There are CGA devices mounted back-to-back on either side of the board and both of these CGA devices have very tight noise requirements on their power services. Research has shown that in order to achieve the best power integrity, such that the noise on the power services in minimized, the power planes must be as close to the top of the circuit board as possible. A power plane is a layer of the PCB configured to distribute power throughout the PCB. Power distribution is further complicated because the CGA devices do not have mirrored pins so that a ground or power pin on the CGA device mounted on one side of the board is not located opposite a like ground or power pin for the CGA device mounted on the opposite side of the board. Therefore, using the via-in-pad layout causes a problem if there is only one set of power planes since the via would touch pads on both of the CGA devices mounted on opposite sides of the board.

The full solution to the power distribution problem is to think of the board as "two halves" under the back-to-back arrangement of CGA devices. Two sets of power layers can then be used; one at the top of the board, and the other at the bottom of the board. The CGA devices then use blind via-in-pads to breakout every pin. A blind via is a via that goes only part way through the board. The blind via creates a signal or conductive path that does not go all the way through from one side of the board to the other. In contrast, a through-hole via uses a hole that goes all the way through the PCB from one side to the other. Through-hole vias are used only for signal paths that connect similarly located pins on both of the CGA devices mounted in a back-to-back arrangement on the top and bottom of the PCB.

Figure 4:
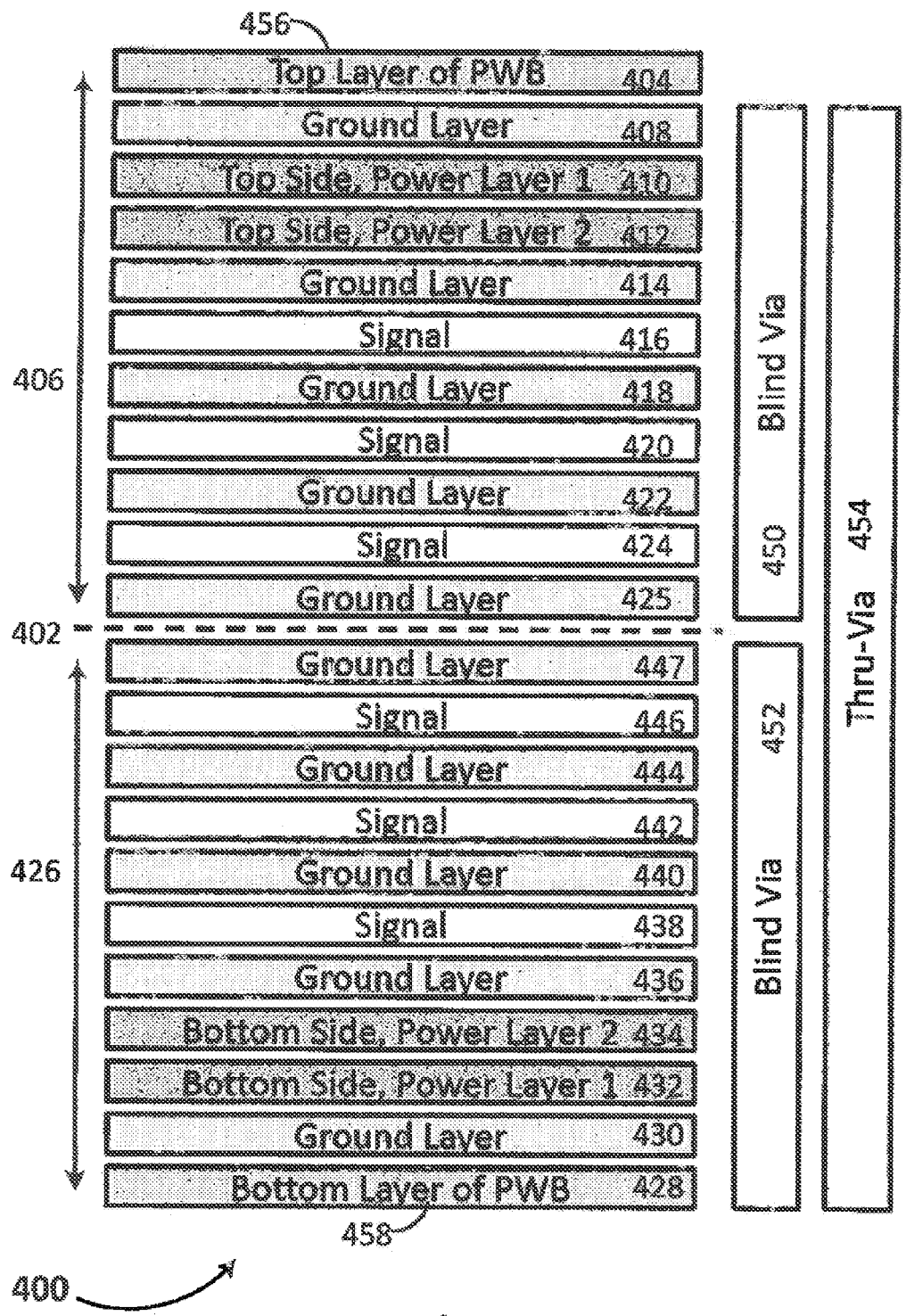
FIG. 4 illustrates one embodiment of a two-halves multi-layer PCB configuration incorporating aspects of the disclosed embodiments.

FIG. 4 illustrates one embodiment of a multi-layer PCB 400 configured in a two halves configuration. The "two halves" configuration is a multi-layer PCB layer configuration used to support back-to-back mounting of similar CGA devices where the layers of the PCB are arranged symmetrically about a central plane 402 which is coplanar with the PCB. The top layer of the PCB 404 and bottom layer of the PCB 428 include the mounting or land pads for connecting electronic components to the PCB as well as signal paths and other features. The term "feature" refers to a geometry of the conductive material and insulating layers formed on or within the PCB. Below the top layer 404 is a first ground layer 408 followed by a first power layer 410 and a second power layer 412 followed by a second ground layer 414. Improved power integrity and noise reduction is provided by sandwiching the two power layers 410, 412 between the two ground layers 408, 414 and placing these power layers 408, 410, 412, 414 near the surface of the PCB. Below the second ground layer 414 are three signal layers 416, 420, 424 interleaved with ground layers 418, 422, 425. The ground layers 418, 422, 425 are interleaved between the signal layers 416, 420, 424 to improve signal quality and increase noise suppression. In the embodiment shown in FIG. 4 the top half 406 of the board includes 2 power layers 410, 412, three embedded signal layers 416, 420, 424, five ground layers 408, 414, 418, 422, 425, and a top layer 404. Alternatively, the number of layers in the PCB stack up can be reduced by eliminating one of the ground layers such as ground layer 418. In the two-halves configuration, the bottom half 426 of the PCB will have the same layers as the top half 406 mirrored about the central plane 402. The layers of the bottom half 426 include a bottom layer 428, a first ground layer 430, a first 432 and second 434 power layer, a second ground layer 436, followed by 3 signal layers 438, 442, 446 interleaved with three ground layers 440, 444, 447. In certain embodiments, it is desirable to include additional or fewer signal and ground layers below the second ground layer 414, 436 as required by the number and complexity of signals needing routing in a particular embodiment. The term, below, as used herein, refers to a position farther away from the surface (top surface 456 or bottom surface 458) of the board nearest to the subject layer. Similarly the term, above, is used herein, to refer to a position closer to the nearest board surface. With the two-halves board configuration 400, many of the via-in-pad features require only blind vias 450, 452 going no more than half way through the board allowing a smaller via diameter to be used. A through via 454 is used to connect similarly located pins on each of the devices in a back-to-back arrangement of CGA devices.

Using the two halves power plane configuration 400 also provides added power integrity to the PCB due to the use of the via-in-pad features. The power and ground connections are made with large diameter vias that go directly to the device's land pad. This cuts down on the amount of impedance added by the circuit board resulting in a cleaner power solution. The two-halves board topology also results in a cross-sectionally symmetric board which is important for structural reasons. An asymmetrical board, which is one with uneven distribution of copper weight, can cause the PCB to have a curve, which puts added stress on the device solder joints. In addition, the blind vias, which, as described above, are vias that go only half way through the board, or partially through the board, can have a smaller diameter since the effective thickness is cut in half from the overall board thickness. This has the benefit of opening up routing possibilities between two vias. When the vias have a smaller diameter, there is more room to fit traces on the board. It has been found that the use of blind vias and the two-halves configuration provides enough room to fit two traces between blind vias, which allows a design that fully breaks out all of the 1752 pins of the CGA devices. Signal traces must have a minimum width, be kept away from other traces by a minimum distance, and be kept away from the vias in order to satisfy the signal and integrity requirements of the Class 3/A quality standard.

In certain embodiments, an alternate via configuration may provide an improved board design. A micro-via can be more advantageous than the via-in-pad configuration in some designs. A micro-via is a via with a very small via diameter or drill size on the order of about 5 to 7 mils. A micro-via is small enough to fit between 32 mil diameter land pads used for a CGA device with a 50 mil or 1.27 mm pin pitch. The micro-via would then hit a trace on the second layer that would be connected by a trace to a larger diameter via under the CGA land pad. The use of micro-vias provides a solution that is electrically equivalent to the via-in-pad solution, however, in the processor board 108 described above, the via-in-pad solution was chosen because it provides superior power integrity and saves adding two additional layers to the PCB to support the micro-vias.

The dense PCB designs described above require significantly increased interconnect capability to support the processing elements being incorporated into the processing system 100 described above with reference to FIG. 1. The processor card 108 had about 4 inches of space for the installation of connectors. To achieve as high a level of functionality as possible the amount of interconnect capability provided in this connector space needs to be maximized. The new processor card 108 increases the amount of interconnect by mounting a pair of similar connectors on either side of the PCB in a back-to-back connector configuration. A back-to-back connector configuration as disclosed herein is where one connector is positioned along the edge and on top of the PCB in a typical fashion and a second connector is positioned on the bottom of the PCB directly opposite the connector on top such that the mounting holes of both connectors line up. Typical connectors on the market today use fly-lead or through hole connectors meaning they need holes in the board to hold the connectors. Through hole connectors do not lend themselves to mounting connectors in a back-to-back configuration because of the need for holes going all the way through the board. This precludes a back-to-back mounting scheme in which like parts are mounted on either side of the board directly opposite each other. The need for holes going all the way through the board prevents through-hole connectors from being mounted in a back-to-back connector configuration. Fly lead connectors can be mounted back-to-back. However, in this configuration they require more board real estate for holes and surface pads used to solder their lead wires.

A newly developed surface mount connector was chosen for the processor card 108 discussed above which provides 85 connections in about 1.5 inches of linear board edge space. Placing two of these connectors back-to-back along the edge of the processor card 100 can provide 170 pins of interconnect in 1.5 inches. This leaves about 2.5 inches of additional space for other required connectors. Earlier processor card designs had only 51 pins of interconnect in a space of about 1.8 linear inches. The new solution provides an improved interconnect density of about 113 pins per inch as compared to 28 pins per inch of the earlier design.

Figure 5A:
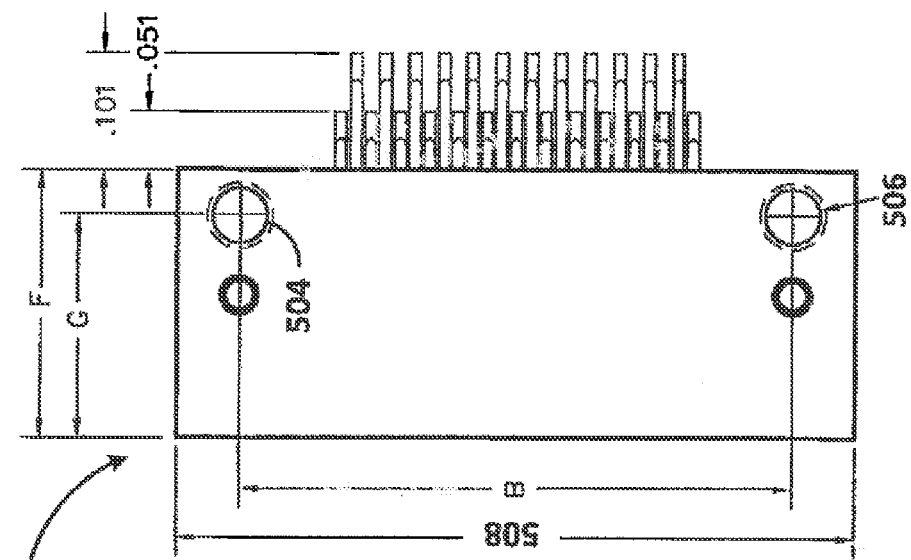
FIG. 5A illustrates a top view of a surface mount PCB board connector incorporating aspects of the disclosed embodiments.
Figure 5B:
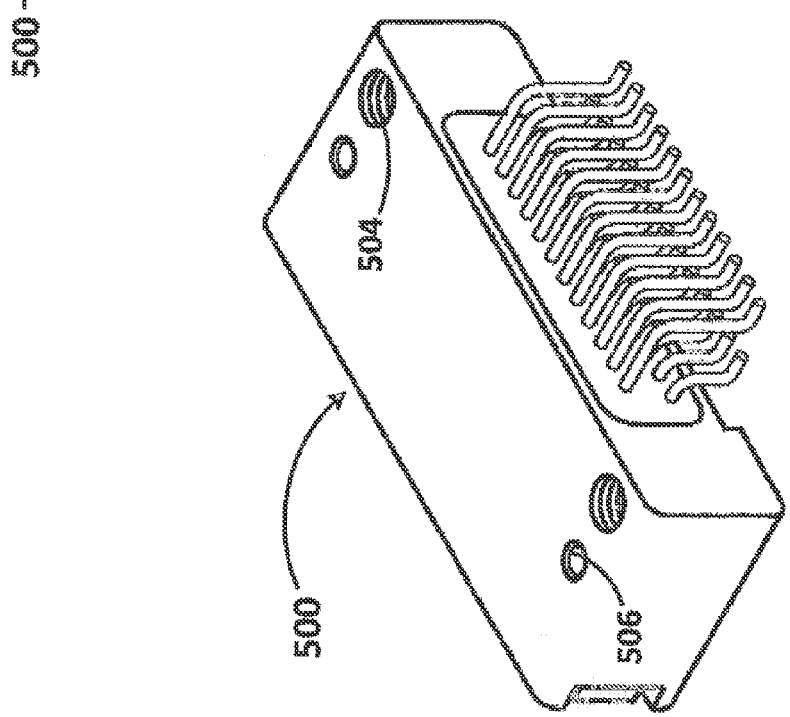
FIG. 5B illustrates a perspective view of a surface mount PCB board connector incorporating aspects of the disclosed embodiments.

FIG. 5A illustrates a top view and FIG. 5B illustrates a perspective view of a two row 25 pin surface mount connector 500 of the same type and configuration as the 85 pin connector discussed above. The connector 500 includes two mounting holes 504, 506 at either end of the connector 500 that have internal threads configured to receive a #0-80 thread screw for the 25 pin connector illustrated or a #2-56 thread screw for an 85 pin connector. A #0-80 thread screw is a screw with a nominal diameter of 0.060 inches with 80 threads per inch and a #2-56 thread screw has a nominal diameter of 0.086 inches with 56 inches per inch. When mounting connectors such as the connector 500 in a back-to-back connector configuration, a single screw is run through the mounting holes at one end of the back-to-back connector configuration such that one end of both connectors are fastened with a single screw. When the mounting holes 504, 506 have internal threads, as is typical of currently available connectors, proper tightening of the connectors cannot be achieved because tolerances in the board thickness cause one of the back-to-back connectors to bind against the PCB before the second connector is properly tightened. To solve this problem, the connectors 500 were modified by removing the internal threads from the mounting holes 504, 506 of both of the back-to-back connectors to allow the screw to freely slide through the mounting holes 504, 506. With this modification, the connectors can be mounted in a back-to-back configuration and appropriately tightened by using a nut at the end of each screw. In certain embodiments, it is desirable to include one of more washers such as for example a flat washer and or a lock washer between the nut and the connector. Connectors 500 can be fabricated with varying numbers of pins such as from 9 to 85 pins, with the only change to the connector dimensions being a longer length 508 for large number of pins. One skilled in the art will recognize that a connector with any number of pins, such as for example 85 pins, may be modified as described above and used in a back-to-back connector configuration without straying from the spirit and scope of the invention.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit and scope of the invention. Moreover, it is expressly intended that all combinations of those elements, which perform substantially the same function in substantially the same way to achieve the same result, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronic assembly for use in space missions, the electronic assembly comprising: a PCB; one or more multi-pin column grid array (CGA) devices coupled to the printed circuit board (PCB); and one or more multi-bin-pad features it, the PCB; wherein each via-in-pad feature comprises a land pad configured to couple a pin of the one or more multi-pin CGA devices to the via, and wherein the PCB comprises a plurality of layers arranged symmetrically in a two-halves configuration above and below a central plane of the PCB; wherein the assembly comprises a pair of CGA device coupled to the PCB in a back-to-back arrangement, and wherein each pin of the first CGA device is located directly opposite a similarly located pin of the second CGA device.

2. The electronic assembly of claim 1, wherein the two halves configuration comprises a plurality of power planes arranged symmetrically about the central plane and disposed in a first power plane group near a top surface of the PCB and a second power plane group near a bottom surface of the PCB.

3. The electronic assembly of claim 2, wherein each of the first and second power plane groups comprises a first ground plane disposed above the plurality of power planes in the group and a second ground plane disposed below the plurality of power planes in the group.

4. The electronic assembly of claim 1, wherein the via-in-pad feature comprises a blind via connecting the land pad to a layer of the plurality of layers in the same half of the PCB.

5. The electronic assembly of claim 1, wherein the via-in-pad feature comprises a through via connecting a pin of the first CGA device with a similarly located pin of the second CGA device.

6. The electronic assembly of claim 1, wherein the via-in-pad feature comprises a blind via electrically coupling a pin of one of the CGA devices to a layer within the same half of the PCB.

7. The electronic assembly of claim 1, the electronic assembly further comprising two connectors mounted along an edge of the PCB in a back-to-back connector configuration, wherein each connector comprises two mounting holes, and each mounting hole has no internal threads.

8. A printed circuit board (PCB) for mechanically supporting and electrically connecting electronic components, the PCB comprising: a plurality of layers, wherein each layer comprises a layer of conductive material bonded to a layer of insulating material; and one or more via-in-pad features, wherein each via-in-pad feature comprises a land pad and a via substantially centered ha the land pad, and wherein the plurality of layers are arranges in a two-halves configuration and symmetrically disposed in a first half above a central plane of the PCB and a second half below the central plane of the PCB, wherein the PCB comprises a too and a bottom surface, and at least one of the one or more via-in-pad features comprises a blind via electrically coupling a land pad on one of the too or bottom surfaces of the PCB with a layer within the same half of the PCB.

9. The PCB of claim 8, wherein the two halves configuration comprises a plurality of power planes disposed symmetrically above and below the central plane of the PCB.

10. The PCB of claim 8, wherein at least one of the one or more via-in-pad features comprises a through via, and the through via comprises a first land pad disposed on a top surface of the PCB and a second land pad dispose on a bottom surface of the PCB.

* * * * *